United States Patent
Hayashi

(10) Patent No.: US 6,933,575 B2
(45) Date of Patent: Aug. 23, 2005

(54) SEMICONDUCTOR DEVICE AND ITS MANUFACTURING METHOD

(75) Inventor: Masahiro Hayashi, Sakata (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/392,269

(22) Filed: Mar. 18, 2003

(65) Prior Publication Data

US 2004/0012054 A1 Jan. 22, 2004

(30) Foreign Application Priority Data

Mar. 18, 2002 (JP) ........................................ 2002-074413

(51) Int. Cl.[7] .......................... H01L 29/76; H01L 29/94
(52) U.S. Cl. ........................................ 257/369; 257/371
(58) Field of Search .......................... 257/369, 371–372, 257/357, 365, 367, 206, 204; 438/223–224

(56) References Cited

U.S. PATENT DOCUMENTS

| | | | | |
|---|---|---|---|---|
| 4,907,058 A | * | 3/1990 | Sakai | 257/371 |
| 6,144,079 A | * | 11/2000 | Shirahata et al. | 257/392 |
| 2004/0046191 A1 | * | 3/2004 | Mori | 257/288 |

FOREIGN PATENT DOCUMENTS

| | | |
|---|---|---|
| JP | 01-268171 | 10/1989 |
| JP | 07-078881 | 3/1995 |
| JP | 08-274268 | 10/1996 |
| JP | 2000-286346 | 10/2000 |
| JP | 2000-294742 | 10/2000 |
| JP | 2001-291678 | 10/2001 |
| JP | 2001-291679 | 10/2001 |
| JP | 2001-291786 | 10/2001 |

* cited by examiner

Primary Examiner—Phat X. Cao
Assistant Examiner—Theresa T. Doan
(74) Attorney, Agent, or Firm—Harness, Dickey & Pierce, P.L.C.

(57) ABSTRACT

A method is provided for manufacturing a semiconductor device that can secure a high breakdown voltage and yet optimize wells. The semiconductor device includes a semiconductor substrate of a first conductivity type, a well of the first conductivity type, a gate dielectric layer formed over the semiconductor substrate, a gate electrode formed over the gate dielectric layer, and a source/drain layer of the second conductivity type formed in the semiconductor substrate. The well of the first conductivity type includes a channel region and is formed in a manner not to overlap the source/drain layers.

4 Claims, 10 Drawing Sheets

SEMICONDUCTOR DEVICE AND ITS MANUFACTURING METHOD

TECHNICAL FIELD

The present invention relates to a semiconductor device having a high breakdown-voltage transistor and a method for manufacturing the same.

BACKGROUND

When a CMOS is fabricated, for example, an impurity region having a conductivity type that is different from or the same as that of a semiconductor substrate is formed in a surface of the semiconductor substrate, in other words, a so-called well structure is used. For this well structure, an impurity concentration of the well is desired to be increased to a relatively high level in view of optimizing the channel length or preventing latch-up. On the other hand, when a high breakdown-voltage transistor is formed in the well, an impurity concentration of the well is desired to be lowered in order to secure high drain breakdown voltage and well breakdown voltage. In this way, when a high breakdown voltage transistor is formed in a well, mutually contradicting factors are required with respect to the impurity concentrations of the well.

It is an object of the present invention to provide a semiconductor device that can secure a high breakdown voltage and yet optimize its wells, and a method for manufacturing the same.

SUMMARY

A semiconductor device in accordance with the present invention includes:

a semiconductor substrate of a first conductivity type;

a well of the first conductivity type formed in the semiconductor substrate;

a gate dielectric layer formed over the semiconductor substrate;

a gate electrode formed over the gate dielectric layer; and a source/drain layer of the second conductivity type formed in the semiconductor substrate, wherein the well of the first conductivity type includes a channel region and is formed in a manner not to overlap the source/drain layer.

In the semiconductor device of the present invention, an impurity concentration of the well that includes a channel region can be set without considering well breakdown voltage, and therefore can be made higher than an impurity concentration of a well of an ordinary high breakdown voltage transistor. Accordingly, in accordance with the present invention, the impurity concentration of the well can be optimally set in view of the channel length and latch-up of the transistor.

Further, in the semiconductor device of the present invention, a high breakdown voltage transistor of the second conductivity type is not formed in the well of the first conductivity type, and thus an area of the well portion where the high breakdown voltage transistor is not formed is not required. As a result, a higher integration of transistors can be achieved.

In the present invention, a "source/drain layer" means a source region or a drain region.

The semiconductor device in accordance with the present invention may include an offset layer composed of an impurity layer of the second conductivity type at least between the source/drain layer and the channel region. By providing such an offset layer, the drain breakdown voltage can be made greater. Also, the semiconductor device in accordance with the present invention may include a well of the second conductivity type that is adjacent to the well of the first conductivity type and surrounds the source/drain layer. By providing such a well of the second conductivity type, for example, the drain breakdown voltage can be made greater.

The offset layer may be located below a dielectric layer formed around the gate dielectric layer. Also, the offset layer may be formed from the well of the second conductivity type.

A method for manufacturing a semiconductor device in accordance with the present invention includes:

(a) forming in a semiconductor substrate of a first conductivity type a well of the first conductivity type that includes a channel region, the well not overlapping a source/drain layer forming area;

(b) forming a gate electrode over the well through a gate dielectric layer; and (c) forming the source/drain layer in a location not overlapping the well.

In the manufacturing method in accordance with the present invention, an offset layer composed of an impurity layer of a second conductivity type may be formed at least between the source/drain layer and the channel region. In the manufacturing method in accordance with the present invention, a well of the second conductivity type may be formed in a manner that it is formed adjacent to the well of the first conductivity type and surrounds the source/drain layer.

In the manufacturing method in accordance with the present invention, the offset layer may be formed by introducing an impurity of the second conductivity type in a specified region of the semiconductor substrate to form an impurity layer, and then forming a dielectric layer by a selective oxidation over the impurity layer. Also, in the manufacturing method in accordance with the present invention, the well of the second conductivity type and the well of the first conductivity type may be formed adjacent to each other in a self-alignment manner, and an offset layer may be formed from the well of the second conductivity type.

DETAILED DESCRIPTION

Embodiments of the present invention will be described below with reference to the accompanying drawings.

1. First Embodiment 1-1. Semiconductor Device

Figure 1:
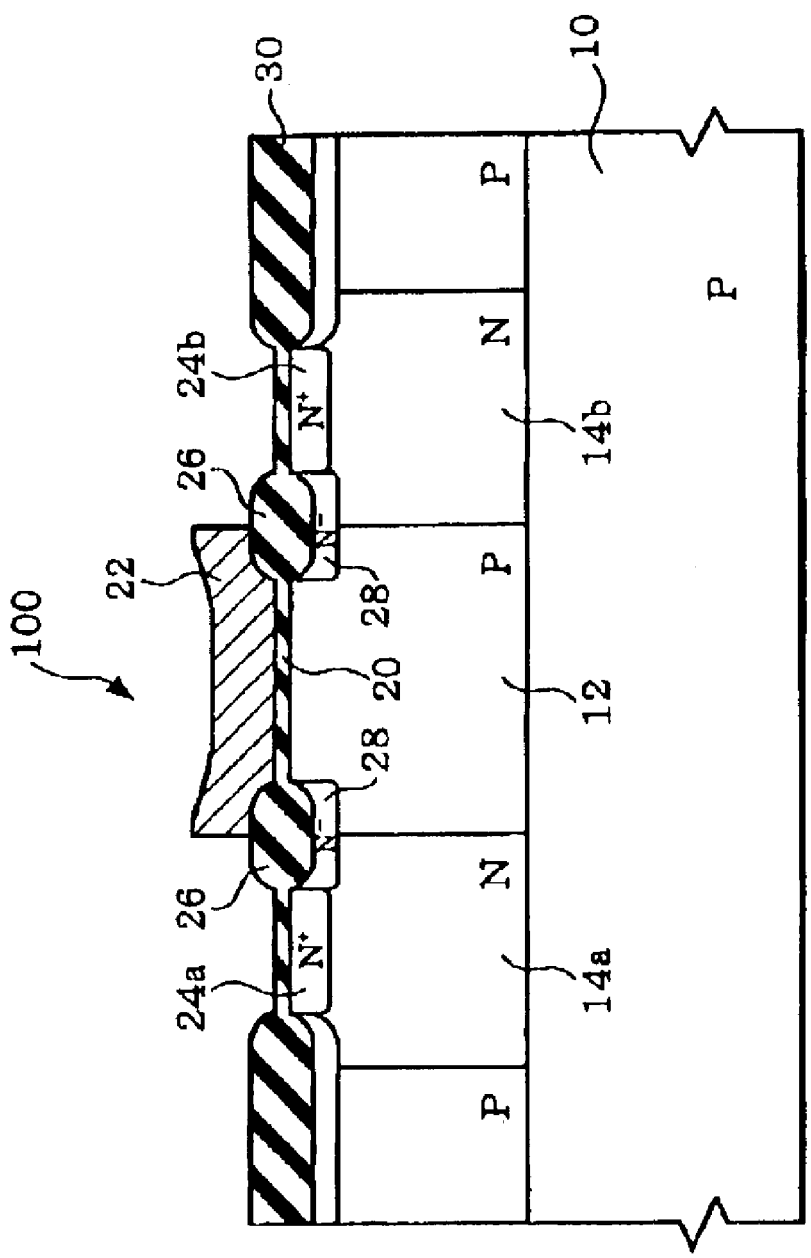
FIG. 1 shows a cross-sectional view of the main portions of a semiconductor device in accordance with an embodiment of the present invention.
Figure 2:
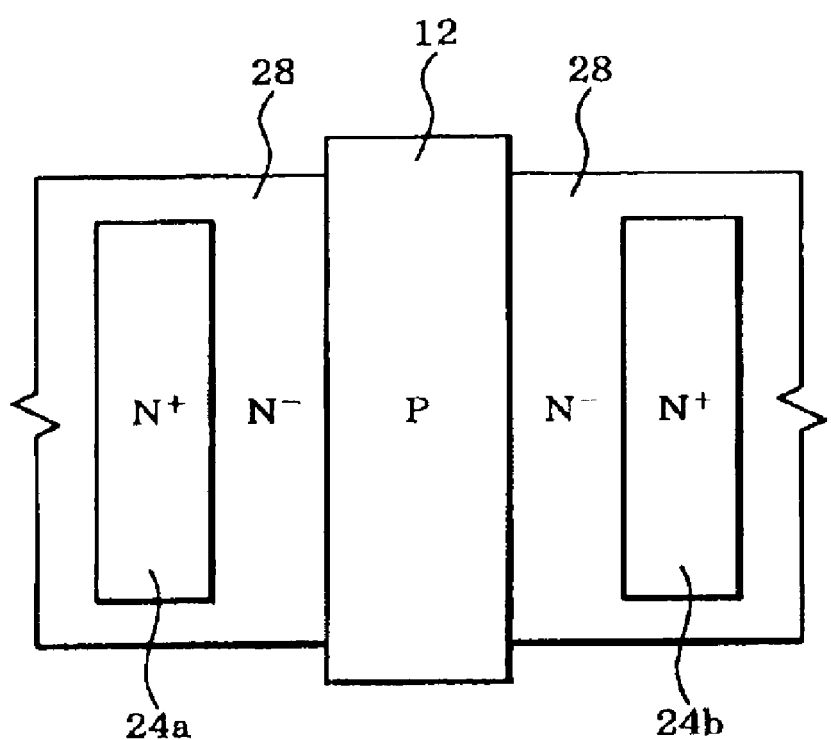
FIG. 2 shows a plan view of the main portions of the semiconductor device shown in FIG. 1.

FIG. 1 schematically shows a cross-sectional view of a semiconductor device in accordance with an embodiment of the present invention. FIG. 2 shows a plan view of the main portions of the semiconductor device shown in FIG. 1. FIG. 2 indicates conductivity types of impurity layers formed in a semiconductor substrate.

A semiconductor device shown in FIG. 1 includes an N-channel type high breakdown voltage transistor 100 formed in a semiconductor substrate 10 (for example, silicon) of a first conductivity type (P-type in this example). A P-type first well 12 is formed in the semiconductor substrate 10. A second well 14a of a second conductivity type (N-type in this example) and an N-type third well 14b are formed on both sides of the first well 12.

The N-channel type high breakdown voltage transistor 100 includes a gate dielectric layer 20 provided over the P-type first well 12, a gate electrode 22 formed on the gate dielectric layer 20, an offset LOCOS layer 26 formed around the gate dielectric layer 20, an offset layer 28 composed of an N-type low concentration impurity layer formed below the offset LOCOS layer 26, and source/drain layers 24a and 24b on the outside of the offset LOCOS layer 26.

In the high breakdown voltage transistor 100, the offset LOCOS layer 26 and the offset layer 28 are present between a channel region formed below the gate dielectric layer 20 and the source/drain layers 24a and 24b, respectively. Also, the high breakdown voltage transistor 100 and an adjacent transistor (not shown) are electrically isolated from each other by an element isolation dielectric layer 30 that is composed of a LOCOS layer.

The first well 12 includes a channel region, and formed in a state in which it is separated from the source/drain layers 24a and 24b. In the illustrated example, an end section of the first well 12 is formed in a manner to be located generally at the center of the offset layer 28. Also, the second well 14a and the third well 14b are formed in contact with the first well 12. The second well 14a is formed in a manner to surround the source/drain layer 24a on one side, and the third well 14b is formed in a manner to surround the source/drain layer 24b on the other side.

The P-type first well 12 is separated from the source/drain layers 24a and 24b by the N-type second and third wells 14a and 14b, respectively, and therefore its requirement to consider the drain breakdown voltage and well breakdown voltage is low. For this reason, an impurity concentration of the first well 12 can be set mainly in view of the channel length, threshold value and latch-up phenomenon of the high breakdown voltage transistor 100. Accordingly, the impurity concentration of the first well 12 can be made higher compared to the level ordinarily required for a well of a high breakdown voltage transistor. As a result, a transistor which is resistant to latch-up and capable of high-speed operation can be realized.

Also, the N-type second and third wells 14a and 14b form a so-called double drain structure, which can further increase the drain breakdown voltage.

The first well 12 can be set at an impurity concentration that is about the same as that of a well in which a low breakdown voltage transistor having a driving voltage of 1.8–5V, for example. The impurity concentration of the first well 12, for example in its surface concentration, may be $4.0 \times 10^{16} - 7.0 \times 10^{17}$ atoms/cm$^3$.

In the semiconductor device in accordance with the present embodiment, an impurity concentration of the first well 12 that includes a channel region can be set without considering a well breakdown voltage, and therefore can be made higher than an impurity concentration that is ordinarily required for a well of a high breakdown voltage transistor. Accordingly, in accordance with the present embodiment, the impurity concentration of the first well 12 can be set in view of the channel length and latch-up of the high breakdown voltage transistor.

Further, in the semiconductor device in accordance with the present embodiment, an N-channel type high breakdown voltage transistor is not formed in the P-type well, and thus an area of the well portion for the transistor that is not formed is not required. As a result, a higher integration of transistors can be achieved.

In the present embodiment, the high breakdown voltage transistor has a LOCOS offset structure and therefore has a high drain breakdown voltage, such that a high breakdown voltage MOSFET can be composed. In other words, by providing the offset impurity layer 28 composed of a low concentration impurity layer below the offset LOCOS layer 26, the offset impurity layer 28 can be made relatively deep against the channel region, compared to the case without the offset LOCOS layer. As a result, when the transistor is in an OFF state, a deep depletion layer can be formed because of the offset impurity layer 28, and a drain breakdown voltage can be increased as the electric field adjacent to the drain electrode is alleviated.

1-2. Manufacturing Process

Next, an example of a method for manufacturing a semiconductor device in accordance with the present invention will be described. FIGS. 3–8 schematically show cross-sectional views indicating a method for manufacturing a semiconductor device shown in FIGS. 1 and 2.

Figure 3:
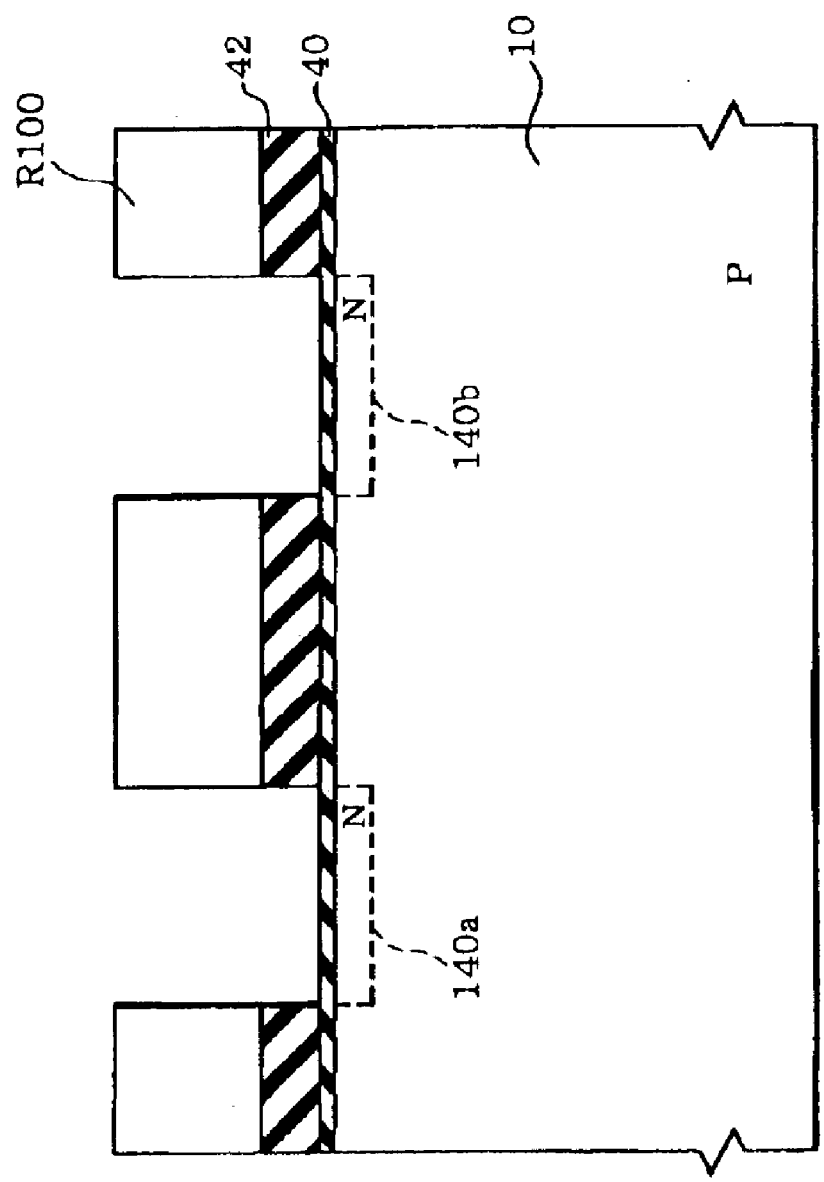
FIG. 3 shows a cross-sectional view indicating a method for manufacturing a semiconductor device in the process order in accordance with an embodiment of the present invention.

(A) As shown in FIG. 3, a P-type semiconductor (silicon) substrate 10 is thermally oxidized to form a silicon oxide layer 40 having a thickness of about 40 nm on a surface of the semiconductor substrate 10. Then, a silicon nitride layer 42 having a thickness of 140–160 nm is formed as an anti-oxidation layer on the silicon oxide layer 40. Then, a resist layer R100 is formed on the silicon nitride layer 42. The resist layer R100 is patterned such that opening sections are formed therein at positions corresponding to N-type second well 14a and third well 14b (see FIG. 1). Then, the silicon nitride layer 42 is etched using the resist layer R100 as a mask. Then, for example, phosphorus ions are implanted in the semiconductor substrate 10 using the resist layer R100 and the silicon nitride layer 42, to form N-type impurity layers 140a and 140b.

When the impurity concentration of the second and third wells 14a and 14b finally obtained (see FIG. 1) is the same as that of an N-type well for a low breakdown voltage transistor, the implantation of ions in this step can be conducted in the same step where ions are implanted in the N-type well for the low breakdown voltage transistor.

Figure 4:
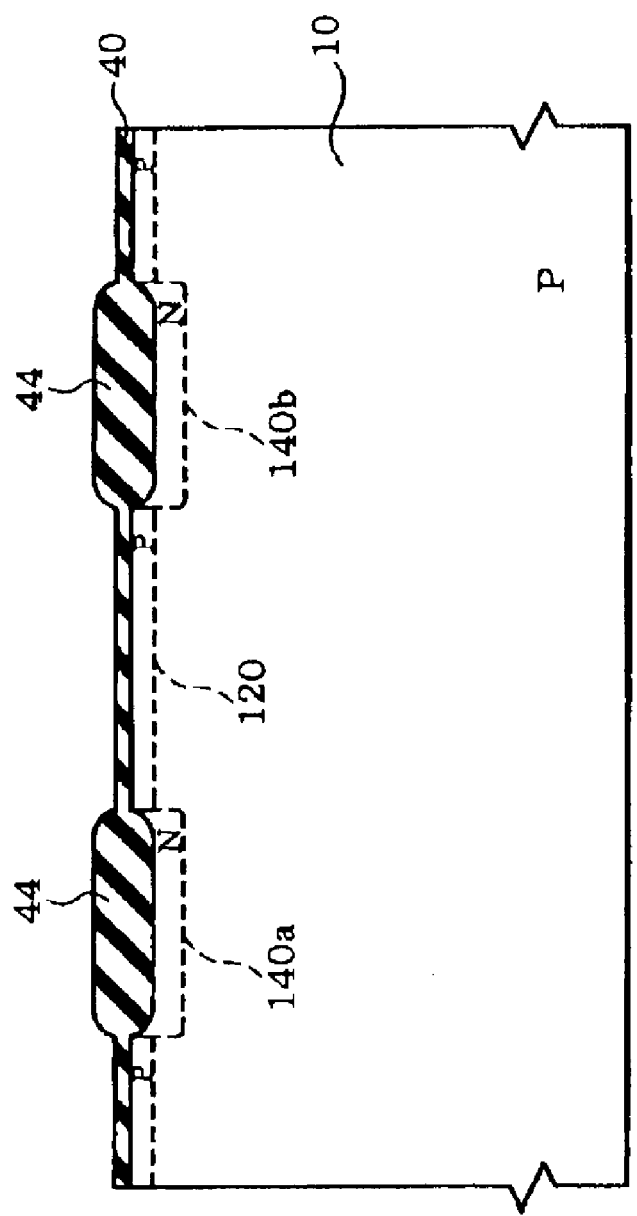
FIG. 4 shows a cross-sectional view indicating the method for manufacturing a semiconductor device in the process order in accordance with an embodiment of the present invention.

(B) As shown in FIG. 3 and FIG. 4, after the resist layer R100 is removed, the semiconductor substrate 10 is thermally oxidized using the silicon nitride layer 42 as an anti-oxidation mask. As a result, a LOCOS layer 44 having a thickness of about 500 nm is formed over the N-type impurity layers 140a and 140b, respectively. Then, after removing the silicon nitride layer 42, boron ions are implanted in the semiconductor substrate 10 using the LOCOS layer 44 as a mask, to form a P-type impurity layer 120 in a self-alignment manner. In the step (B) shown in FIG. 4, convex and concave portions are formed in a surface of the semiconductor substrate 10 by the selective oxidation; however, the illustrations in FIG. 5 and succeeding figures do not show these convex and concave portions for the sake of simplification of the drawings.

When the impurity concentration of the first well 12 finally obtained (see FIG. 1) is the same as that of a P-type well for a low breakdown voltage transistor, the implantation of ions in this step can be conducted in the same step where ions are implanted in the P-type well for the low breakdown voltage transistor.

Figure 5:
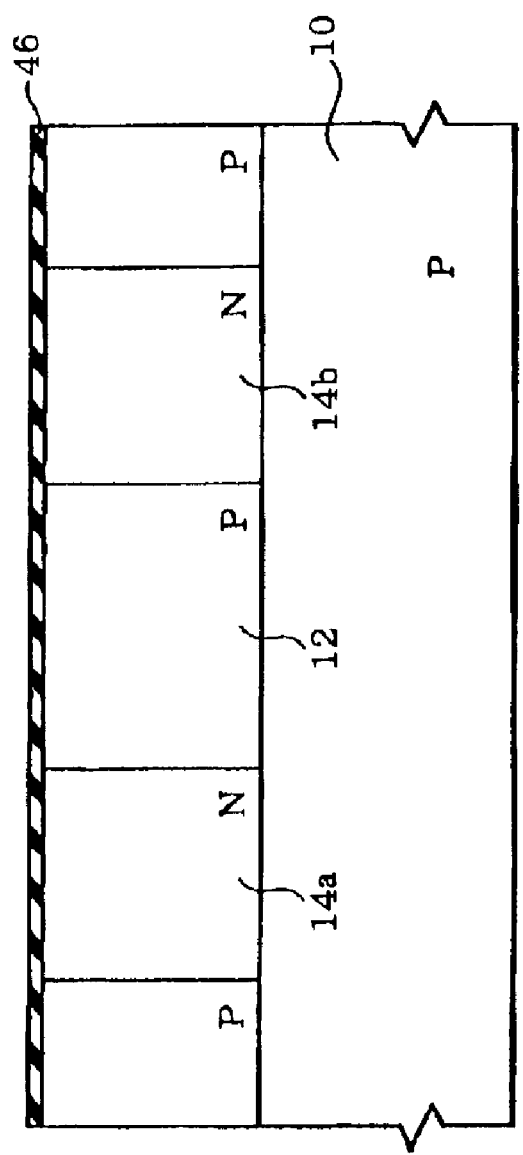
FIG. 5 shows a cross-sectional view indicating the method for manufacturing a semiconductor device in the process order in accordance with an embodiment of the present invention.

(C) As shown in FIG. 4 and FIG. 5, after removing the silicon oxide layer 40 and the LOCOS layer 44, a silicon oxide layer 46 is formed by thermal oxidation over the semiconductor substrate 10. Then, impurities in the P-type impurity layer 120 and the N-type impurity layers 140a and 140b are diffused (driven in) by a heat treatment, such that a P-type first well 12, and N-type second and third wells 14a and 14b are formed adjacent to one another in a self-alignment manner.

Figure 6:
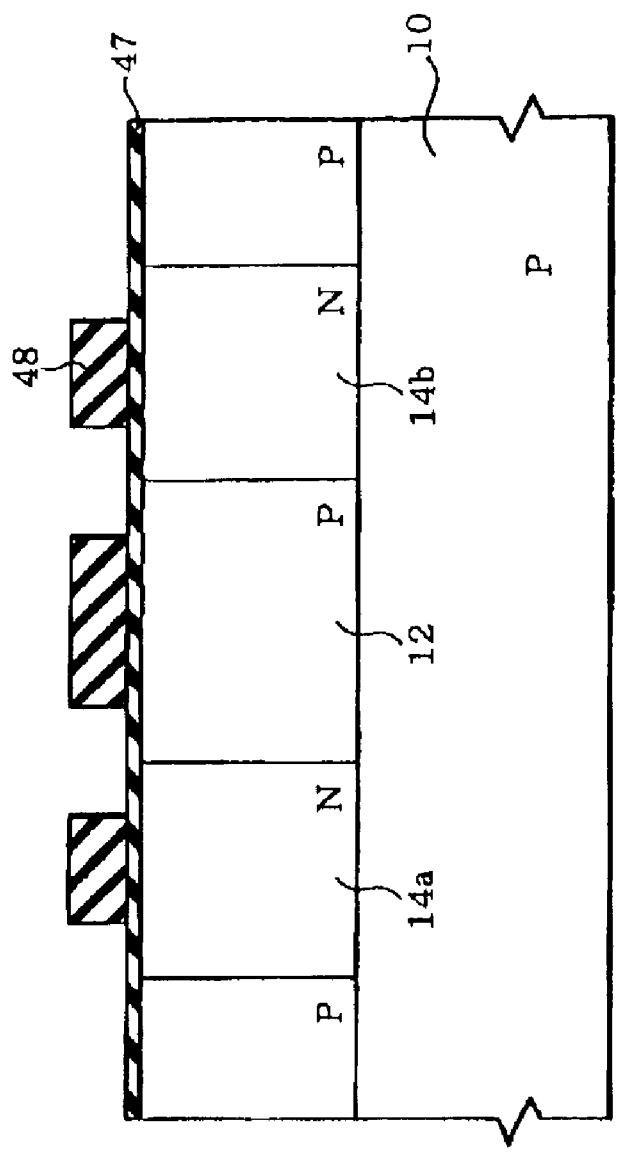
FIG. 6 shows a cross-sectional view indicating the method for manufacturing a semiconductor device in the process order in accordance with an embodiment of the present invention.

(D) As shown in FIG. 5 and FIG. 6, after removing the silicon oxide layer 46 that has become thicker by the heat treatment, a new silicon oxide layer 47 is formed by thermal oxidation over the semiconductor substrate 10. Then, a patterned silicon nitride layer 48 is formed over the silicon oxide layer 47. The patterned silicon nitride layer 48 is formed in a manner similar to the previous step (A), i.e., by etching a silicon nitride layer using a resist layer (not shown) as a mask. The silicon nitride layer 48 includes openings in areas corresponding to an element isolation dielectric layer 30 and a LOCOS layer 26 shown in FIG. 1.

Figure 7:
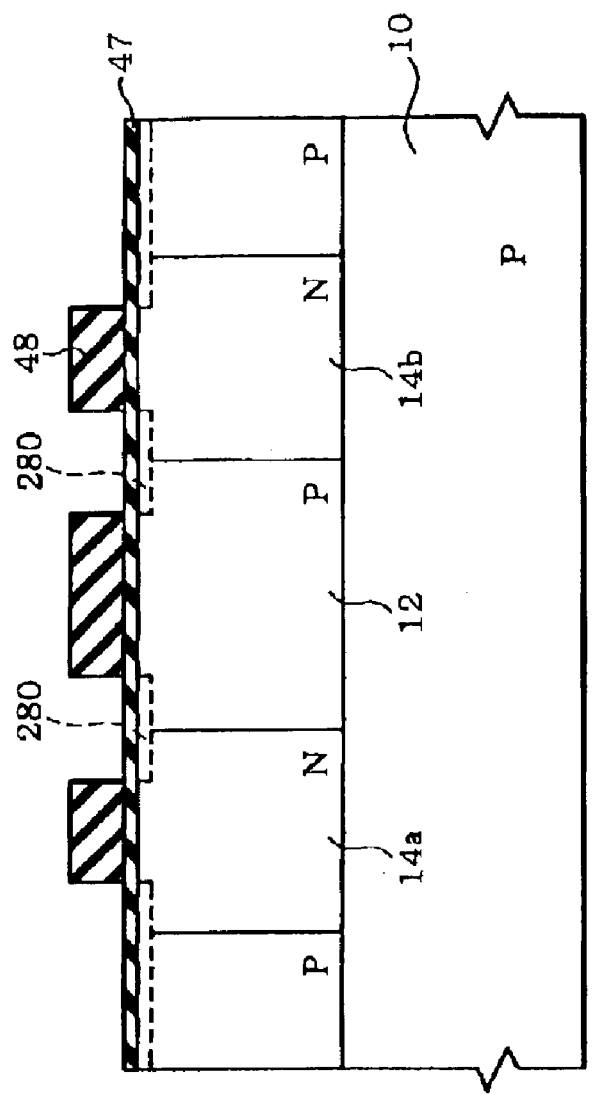
FIG. 7 shows a cross-sectional view indicating the method for manufacturing a semiconductor device in the process order in accordance with an embodiment of the present invention.

(E) As shown in FIG. 7, phosphorous ions are implanted in the semiconductor substrate 10 using the silicon nitride layer 48 as a mask to form an N-type impurity layer 280.

Figure 8:
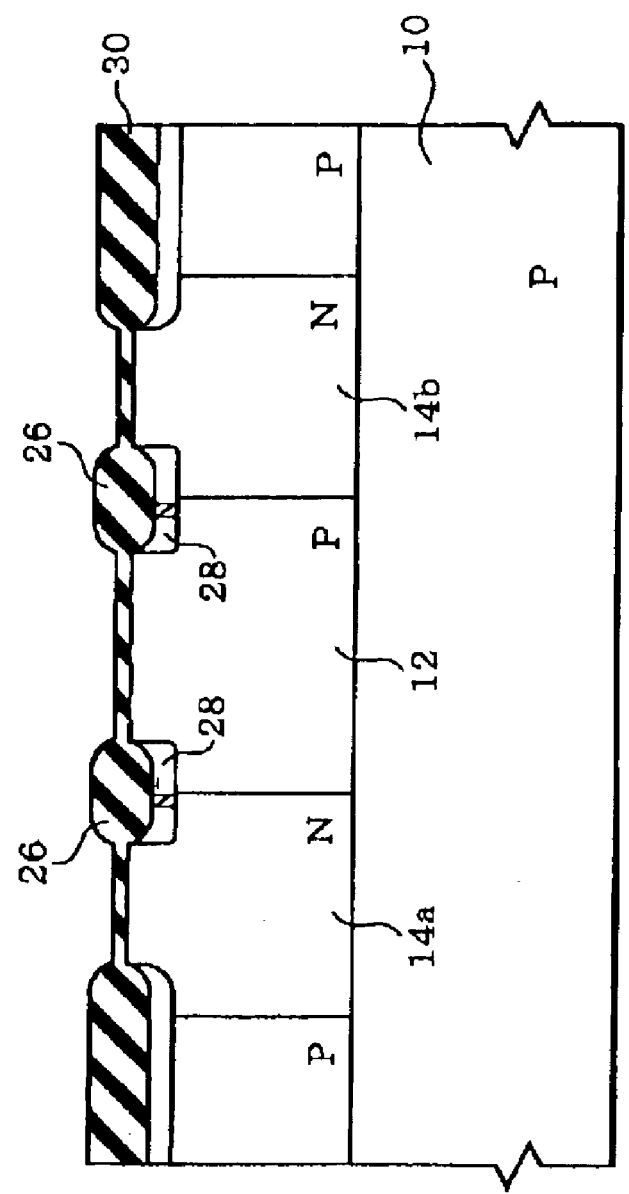
FIG. 8 shows a cross-sectional view indicating the method for manufacturing a semiconductor device in the process order in accordance with an embodiment of the present invention.

(F) As shown in FIG. 7 and FIG. 8, the surface of the semiconductor substrate 10 is thermally oxidized using the silicon nitride layer 48 as an anti-oxidation mask. By this, an element isolation dielectric layer 30 composed of the LOCOS layer and an offset LOCOS layer 26 are formed. Further, an offset layer 28 composed of an N-type low concentration impurity layer is formed below the offset LOCOS layer 26. Also, an N-type low concentration impurity layer is formed below the element isolation dielectric layer 30.

Then, a gate dielectric layer, a gate electrode and source/ drain layers are formed by a known method, to form a high breakdown voltage transistor 100 shown in FIG. 1.

By the manufacturing method in accordance with the present embodiment, the P-type first well 12 and N-type second and third wells 14a and 14b can be formed in a self-alignment manner in the steps (A) through (C) described above.

By the manufacturing method in accordance with the present embodiment, impurities in the P-type impurity layer 120 and the N-type impurity layers 140a and 140b are diffused by a heat treatment in the step (C) described above, such that the P-type first well 12 and the N-type second and third wells 14a and 14b can be simultaneously formed.

Second Embodiment

Figure 9:
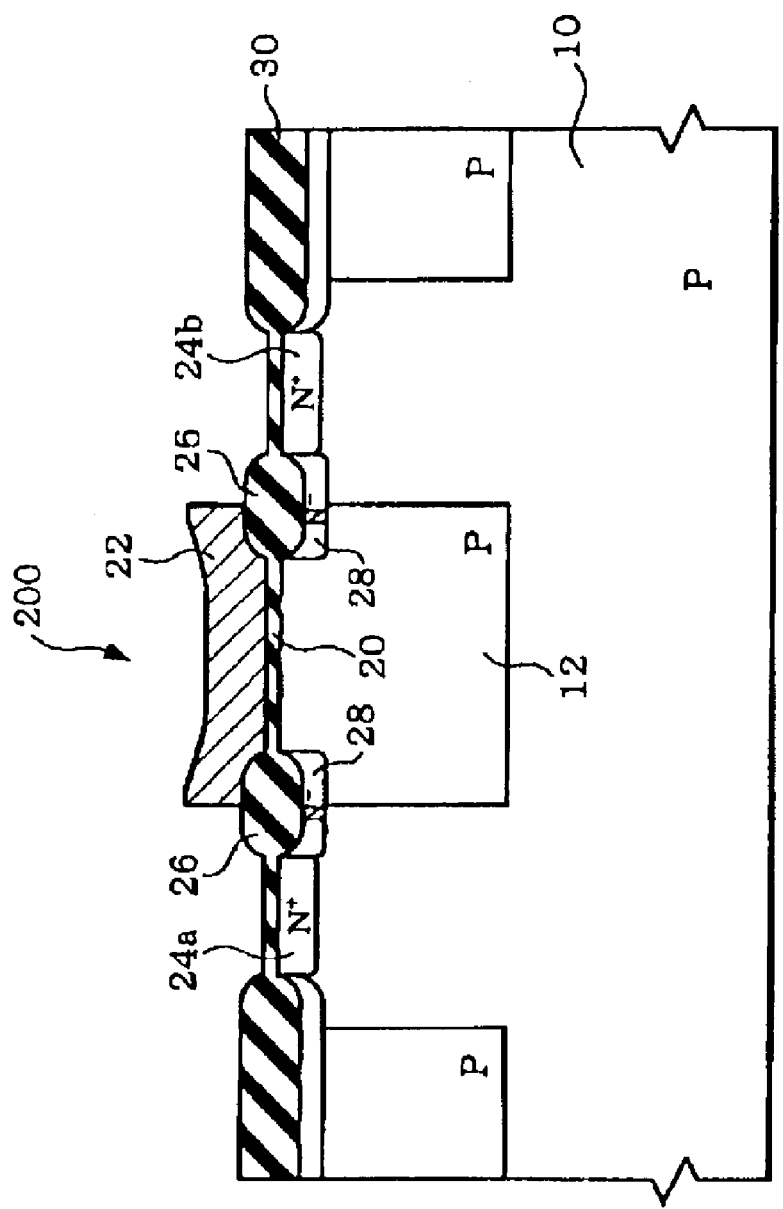
FIG. 9 shows a cross-sectional view of the main portions of a high breakdown voltage transistor in accordance with another embodiment of the present invention.

FIG. 9 schematically shows a cross-sectional view of a semiconductor device in accordance with an embodiment of the present invention. Members having substantially the same function as those of the members shown in FIG. 1 are assigned the same reference numbers, and their detailed description is omitted.

A semiconductor device 200 in accordance with the present embodiment is different from the semiconductor device of the first embodiment in that the second embodiment does not have N-type second and third wells. The semiconductor device 200 having such a structure can also have functions similar to those of the semiconductor device of the first embodiment.

The semiconductor device 200 of the present embodiment can be manufactured by a method that is basically the same as the manufacturing method described in the first embodiment. However, since second and third wells do not have to be formed, a well 12 can be formed by implanting a P-type impurity in a specified region of a semiconductor substrate using, for example, a resist layer as a mask, and then conducting a heat treatment, instead of the steps (A) through (C) shown in FIGS. 3–5.

Third Embodiment

Figure 10:
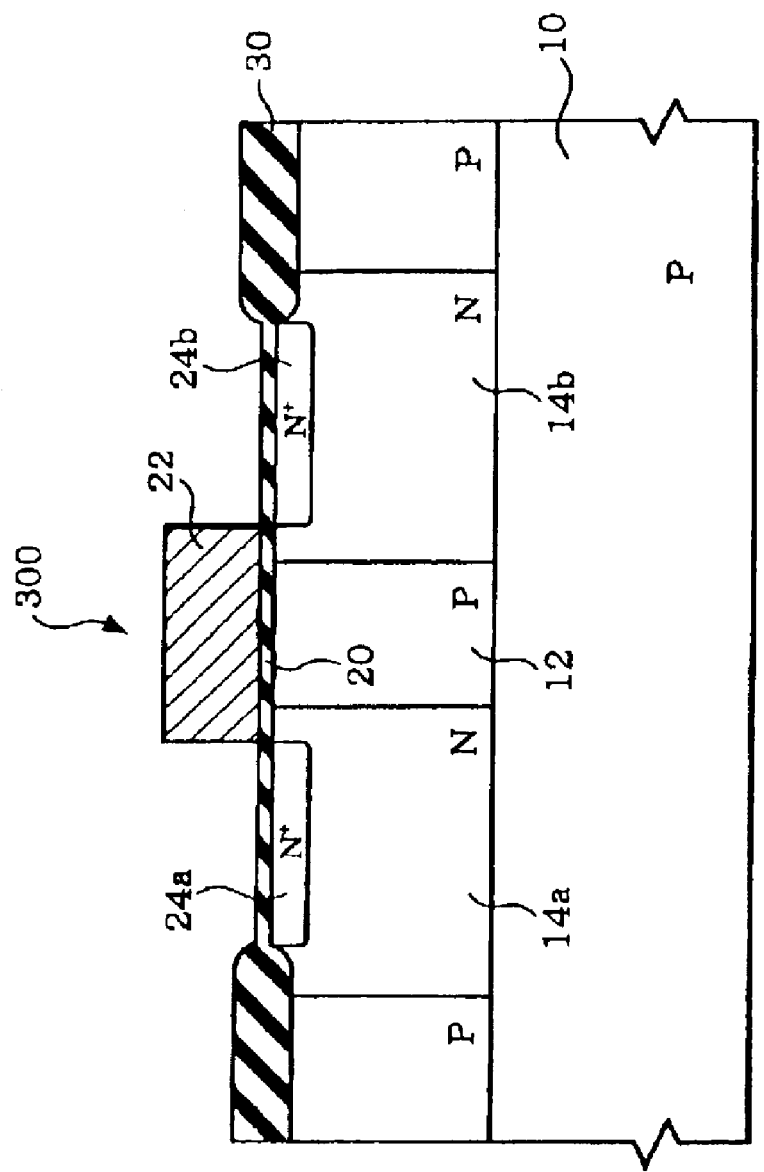
FIG. 10 shows a cross-sectional view of the main portions of a high breakdown voltage transistor in accordance with another embodiment of the present invention.

FIG. 10 schematically shows a cross-sectional view of a semiconductor device in accordance with an embodiment of the present invention. Members having substantially the same function as those of the members shown in FIG. 1 are assigned the same reference numbers, and their detailed description is omitted.

A semiconductor device 300 in accordance with the present embodiment is different from the semiconductor device of the first embodiment in that the third embodiment does not have a LOCOS offset structure as an offset structure.

In other words, the semiconductor device 300 does not have an offset LOCOS layer 26 or an offset layer 28 that is provided in the semiconductor device shown in FIG. 1. Further, in the semiconductor device 300, second and third wells 14a and 14b composed of N-type low concentration impurity layers function as offset layers, and form a so-called double drain structure.

The semiconductor device 300 having such a structure may be inferior in terms of the breakdown voltage to the semiconductor device of the first embodiment in some cases, but has similar functions to the semiconductor device of the first embodiment in other areas.

The semiconductor device 300 of the present embodiment can be manufactured by a method that is basically the same as the manufacturing method described in the first embodiment. However, since a LOCOS offset structure does not have to be formed, the steps (D) through (F) shown in FIGS. 6–8 are not required.

The present invention is not limited to the embodiments described above, and many modifications can be made within the scope of the subject matter of the present invention. For example, the embodiment described above shows an example in which the first conductivity type is P-type and the second conductivity type is N-type. However, these conductivity types may be reversed if desired. Also, the layer structure or plan structure of the semiconductor device can be different from those of the embodiment described above depending on the desired design.

The entire disclosure of Japanese Patent Application No. 2002-074413 filed Mar. 18, 2002 is incorporated by reference.

What is claimed is:

1. A semiconductor device, comprising:
   a semiconductor substrate of a first conductivity type;
   a well of the first conductivity type formed in the semiconductor substrate;
   a gate dielectric layer formed above the semiconductor substrate;
   a gate electrode formed above the gate dielectric layer;
   a source/drain layer of the second conductivity type formed in the semiconductor substrate, wherein the well of the first conductivity type comprises a channel region and is offset from the source/drain layer;
   a first well of the second conductivity type that is adjacent to the well of the first conductivity type on a first side, and that surrounds a first portion the source/drain layer;
   a second well of the second conductivity type that is adjacent to the well of the first conductivity type on a second side, and that surrounds a second portion of the source/drain layer.

2. A semiconductor device according to claim 1, comprising an offset layer composed of an impurity layer of the second conductivity type at least between the source/drain layer and the channel region.

3. A semiconductor device according to claim 2, wherein the offset layer is located below a dielectric layer formed around the gate dielectric layer.

4. A semiconductor device according to claim 2, wherein the offset layer is formed from one of the first and second well of the second conductivity type.

* * * * *